United States Patent [19]

Sahara et al.

[11] Patent Number: 4,764,804

[45] Date of Patent: Aug. 16, 1988

[54] SEMICONDUCTOR DEVICE AND PROCESS FOR PRODUCING THE SAME

[75] Inventors: Kunizo Sahara, Tokyo; Kanji Otsuka; Hisashi Ishida, both of Higashiyamato, all of Japan

[73] Assignee: Hitachi, Ltd., Tokyo, Japan

[21] Appl. No.: 15,019

[22] Filed: Feb. 17, 1987

[30] Foreign Application Priority Data

Feb. 21, 1986 [JP] Japan .................. 61-35105

[51] Int. Cl.⁴ .............................. H01L 23/26
[52] U.S. Cl. .................. 357/81; 174/16 HS; 361/387; 437/209; 437/215; 437/221; 437/224
[58] Field of Search ............. 357/81; 174/16 HS; 361/386, 387, 388; 437/209, 210, 211, 212, 213, 214, 215, 216, 217, 218, 219, 220, 221, 222, 223, 224

[56] References Cited

U.S. PATENT DOCUMENTS

| | | | |
|---|---|---|---|
| 3,675,089 | 7/1972 | Hantusch et al. | 357/81 |
| 3,686,748 | 8/1972 | Engeler et al. | 357/81 X |
| 3,761,783 | 9/1973 | Kroger et al. | 357/81 X |
| 3,922,775 | 12/1975 | Potter | 357/81 X |
| 3,961,103 | 6/1976 | Aisenberg | 427/39 |
| 4,339,870 | 7/1982 | Ball et al. | 357/76 X |
| 4,571,447 | 2/1986 | Prins | 357/30 X |
| 4,582,954 | 4/1986 | Eaton et al. | 361/388 X |
| 4,651,192 | 3/1987 | Matshshita et al. | 357/81 X |
| 4,703,339 | 10/1987 | Matsuo | 357/81 |

FOREIGN PATENT DOCUMENTS 1108191 5/1986 Japan .................. 357/81

OTHER PUBLICATIONS

Loeffel et al., Heat Transfer Apparatus for Semiconductor Chip, IBM Tech. Disc. Bull., V. 21, #6, Nov. 1978, p. 2430 relied on.

*Primary Examiner*—R. R. Kucia
*Attorney, Agent, or Firm*—Antonelli, Terry & Wands

[57] ABSTRACT

A semiconductor device having improved heat-dissipating characteristics employs a thin insulator film made of diamond, which has excellent thermal conductivity, as an insulator film which is formed on a chip immediately below a heat-dissipating bump electrode. Since the thin diamond film has excellent insulating properties and high thermal conductivity, it is possible to improve heat-dissipating characteristics of even a high-power semiconductor device such as a multichip module. In the case of, particularly, a multichip module, the insulation between a mother chip and a child chip can also be ensured by the presence of the thin diamond film.

5 Claims, 3 Drawing Sheets

SEMICONDUCTOR DEVICE AND PROCESS FOR PRODUCING THE SAME

BACKGROUND OF THE INVENTION

The present invention relates to a semiconductor device and a process for producing the same. More particularly, the present invention pertains to a technique for improving heat dissipating characteristics of semiconductor devices.

Considerations of thermal design in semiconductor devices are very important. Thermal design is particularly important to multichip modules involving relatively large power dissipation such as those which have a plurality of semiconductor elements (chips), e.g., IC's and LSI's, mounted thereon.

One example of the structure for such multichip module will be explained through a multichip module which has already been proposed by the applicant of the present invention.

More specifically, the prior art multichip module has the following structure. A chip (referred to as a "mother chip" in this case) which is defined by a wiring board formed by providing a multilayer wiring structure on a silicon substrate is rigidly secured to the lower surface of a board of a package. A multiplicity of chips (referred to as "child chips" in this case) defined by semiconductor elements such as IC's or LSI's are rigidly secured to the lower surface of the mother chip, the child chips being electrically connected by so-called CCB (controlled collapse bonding). Leads for external connection are interposed between the package board and a cap for the package. The mother chip and the leads are electrically connected, i.e., wired by connecting wires, and fins for heat dissipation are attached to the upper surface of the package board.

Bump electrodes made of solder are generally employed for the CCB electrical connection employed for electrical wiring between the chips. It should be noted that the bump electrodes include electrically conductive bumps for transferring electric signals between the mother chips and the child chips, and heat-dissipating bumps (dummy bumps) for merely dissipating the heat generated in the child chips to the external environment through the mother chip and then the heat-dissipating fins. The heat-dissipating bumps maintain electrical insulation between the mother chip and the child chips, and while doing so, they transfer the heat from the child chips to the mother chip and dissipate the transferred heat to the external environment. Accordingly, an insulator film for electrical insulation is provided directly below a portion of each heat-dissipating bump which is in contact with either the mother chip or a child chip.

The insulator film provided directly below a heat-dissipating bump electrode has heretofore been defined by a film generally made of silicon oxide $SiO_2$, silicon nitride $Si_3N_4$ or the like. For this reason, this insulator film is inferior in terms of thermal conductivity, and since the heat-dissipating bump electrode is interposed, the thermal resistance at this electrode portion is disadvantageously high, which is a problem in terms of heat-dissipating characteristics of multichip modules of the type described above, particularly high-power multichip modules.

SUMMARY OF THE INVENTION

In view of the above-described circumstances, the present invention aims at providing a technique for improving an insulator film which is contiguous with a heat-dissipating bump electrode in a semiconductor device such as a multichip module of the type described above.

Thus, it is a primary object of the present invention to provide a semiconductor device such as a multichip module which has improved heat-dissipating characteristics and a process for producing the same.

The above and other objects, features and novel advantages of the present invention will become more apparent from the following description of the preferred embodiments thereof, taken in conjunction with the accompanying drawings.

A representative of the novel techniques disclosed in this application will briefly be explained below.

According to the present invention, an insulator film which is disposed immediately below a heat-dissipating bump electrode is defined by a thin insulator film made of diamond, which has excellent thermal conductivity.

By virtue of the excellent insulating properties and high thermal conductivity of the thin diamond film, it is possible to improve the heat-dissipating characteristics of even a semiconductor device such as a high-power multichip module.

In the case of, particularly, a multichip module, insulation between a mother chip and child chips can also be ensured by the presence of the thin diamond film.

DESCRIPTION OF THE PREFERRED EMBODIMENTS

[Embodiment 1]

The present invention will be described through one embodiment and with reference to the accompanying drawings.

Figure 1:
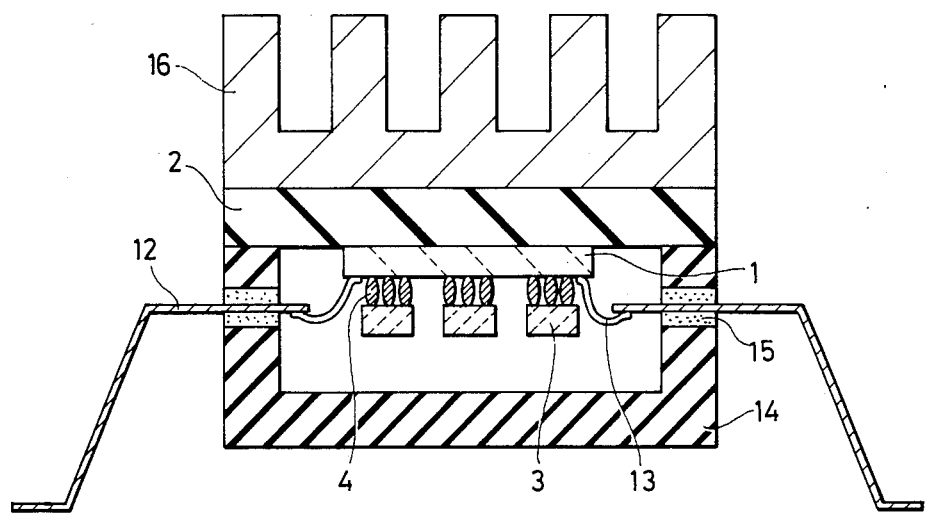
FIG. 1 is a sectional view of a semiconductor device in accordance with one embodiment of the present invention.
Figure 2:
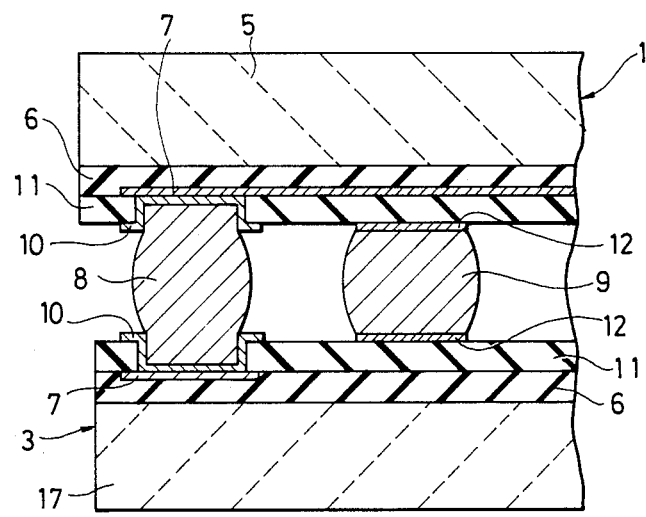
FIG. 2 is an enlarged sectional view showing an essential part of the semiconductor device illustrated in FIG. 1.

FIG. 1 is a sectional view of silicon-on-silicon multichip module (semiconductor device) in accordance with one embodiment of the present invention, and FIG. 2 is an enlarged sectional view of an essential part of the multichip module illustrated in FIG. 1.

A mother chip 1 is defined by a wiring board with a circuit function which is formed by providing a silicon substrate with a circuit function such as an IC or LSI and a multilayer wiring structure. One surface (the reverse surface) of the mother chip 1 is rigidly secured to a board 2 of a package by means, for example, of a silicone rubber adhesive. Each of the child chips 3 is formed with a semiconductor element such as an IC or LSI. One surface (the main or obverse surface) of each child chip 3 is rigidly secured to the other surface (main or obverse surface) of the mother chip 1 through bump electrodes 4 made of solder.

FIG. 2 is an enlarged sectional view showing a joint between the mother chip 1 and one of the child chips 3 through bumps 4.

The mother chip 1 includes a silicon substrate which is provided with a circuit function such as an IC or LSI, and has a multilayer wiring structure consisting of an aluminum film and an insulator film. The silicon substrate is made of the same kind of material as that of the child chips in order to obtain coincidence in, for example, thermal expansion coefficient therebetween. The surface of a semiconductor active region 5 of the mother chip 1 is covered with an insulator film 6 made of, for example, silicon nitride $Si_3N_4$ or silicon oxide $SiO_2$, and an electrode wiring 7 made of aluminum (Al) is laid on the surface of the insulator film 6. The bumps 4, which are made of solder, include an electric signal transfer bump (electrically conducting bump) 8 on the left-hand side as viewed in FIG. 2 and a heat-dissipating bump (dummay bump) 9. The conducting bump 8 is connected to the aluminum electrode wiring 7 through a barrier metal 10, so that the mother chip 1 is electrically connected to the child chip 3 formed in a manner similar to that of the mother chip 1. This module has about 200 conducting bumps and about 500 heat-dissipating bumps.

A thin diamond film 11 is formed on the surface of the mother chip 1, and the heat-dissipating bump 8 is rigidly secured to the thin diamond film 11 through a bonding metal 12, and is further connected to the child chip 3 formed in a manner similar to that of the mother chip 1. As illustrated in FIG. 1, one end portion of the mother chip 1 and one end portion of a lead 12 for external connection are wire-bonded together using a connecting wire 13.

The leads 12 are interposed between the package board 2 and a cap 14 for the package. The reference numeral 15 in FIG. 1 denotes a sealing material.

As shown in FIG. 1, a heat-dissipating fin 16 is attached to the surface of the board 2 on the side thereof which is remote from the mother chip 1. The thin diamond film 11 in the present invention is preferably formed by a known electron beam CVD (chemical vapor deposition) from the viewpoint of electrically insulating performance and deposition speed. It is possible to employ, in addition to the chemical vapor deposition, a method in which a gas mixture of methane and hydrogen is allowed to react under an appropriate pressure and heating temperature to form diamond in the shape of a thin film, and a method in which an organic compound containing carbon, hydrogen and oxygen, e.g., alcohol, is employed in place of methane gas, and such organic compound is liquefied and reacted with hydrogen at an appropriate temperature to form a thin diamond film. The thermal conductivity of the thin diamond film is substantially equal to or higher than that of silicon carbide SiC, which is 0.64. It will be understood that the thermal conductivity of the diamond film is considerably large as compared with that of silicon oxide film, which ranges from 0.0033 to 0.004, and that of silicon nitride film, which ranges from 0.03 to 0.05. It should be noted that the unit of the thermal conductivity is $[cal \cdot cm^{-1} \cdot S^{-1} \cdot °C.^{-1}]$.

Each of the child chips 3 employed in the present invention is formed using, for example, a silicon single crystal substrate as a starting material, and has a multiplicity of circuit elements which are formed in the chip 3 by a known technique, together with a multilayer wiring structure, thereby providing the chip 3 with one circuit function such as an IC or LSI. Practical examples of the circuit elements are MOS transistors, and these circuit elements are arranged to provide a circuit function of, for example, a memory or logic circuit. The reference numeral 17 in FIG. 2 denotes a semiconductor active region in the child chip 3. The above-described circuit function of an IC or LSI is formed in the semiconductor active region 17.

The mother chip 1 is also formed using, for example, a silicon single crystal substrate as a starting material, and has a circuit function such as an IC or LSI and wiring, in a manner similar to that of the child chip 3.

The bumps 4 made of solder are constituted by bumps such as those which are employed as known flip chip connecting terminals, and defined by hemispheric bumps (salient electrodes) formed using, for example, tin (Sn)-containing lead (Pb) for controlled collapse bonding.

The barrier metal 10 is defined by a triple layer structure consisting of, for example, a chromium (Cr) layer, a copper (Cu) layer and a gold (Au) layer, i.e., (Cr/Cu/Au).

The package board 2 is made of, for example, silicon carbide SiC.

The leads 12 for external connection are made of an alloy containing iron as its principal component, such as 42 Alloy or Kovar (trade name), or a Cu-based alloy.

The connecting wire 13 is defined by, for example, a thin aluminum (Al) wire.

The heat-dissipating fin 16 is made of, for example, aluminum (Al), and formed so as to have a multiplicity of branch portions in order to increase the surface area as much as possible.

According to the above-described embodiment of the present invention, the heat generated in the semiconductor active region 17 of the child chip 3 is dissipated through the thin diamond insulator film 11, the heat-dissipating bump 9, the mother chip 1, the package board 2 and the heat-dissipating fin 16. Since the thin diamond film 11, which is formed by the electron beam CVD, has excellent thermal conductivity, it is possible to obtain a multichip module having improved heat-dissipating characteristics.

Although the invention accomplished by the present invention has practically been described through the embodiment, it should be noted here that the described embodiment is not necessarily limitative and various changes and modifications may, of course, be imparted thereto without departing from the scope and spirit of the invention.

For example, although in the above-described embodiment the thin diamond film 11 is coated on the insulator film 6 made of silicon nitride $Si_3N_4$, the thin diamond film 11 may replace all the insulator film employed rather than replacing a part of the insulator film.

Although the present invention has mainly been described through one embodiment in which the invention is applied to a silicon-on-silicon multichip module that is a background art on which the present invention is based, such multichip module is not necessarily limitative, and the present invention may widely be applied to other types of semiconductor devices.

Thus, according to the present invention, the heat generated in a semiconductor active region is dissipated through a heat-dissipating bump which is connected to the active region through an insulator film made of diamond. It is therefore advantageously possible to improve the heat-dissipating characteristics of the semiconductor device.

[Embodiment 2]

Another embodiment of the present invetion will be described hereinunder with reference to the accompanying drawings.

Figure 3:
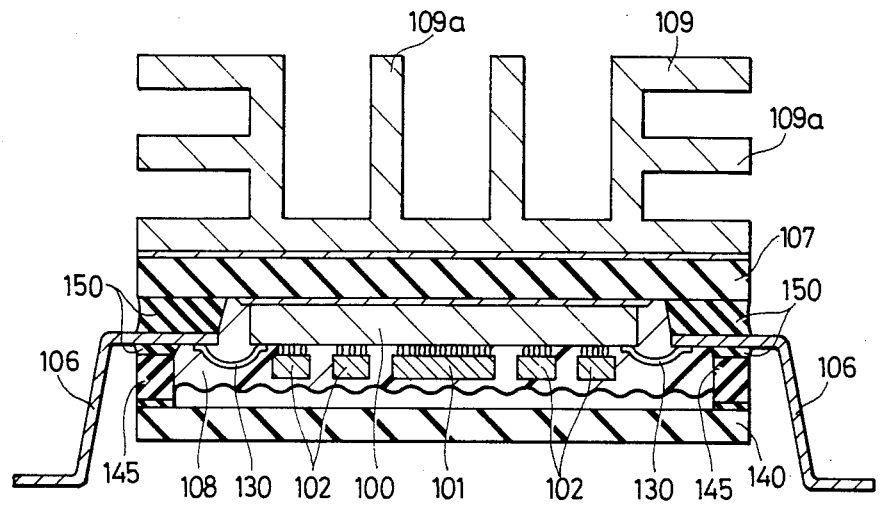
FIG. 3 is a sectional view of a selicon-on-silicon multichip module (semiconductor device) in accordance with another embodiment of the present invention.

FIG. 3 is a sectional view of a silicon-on-silicon multichip module (semiconductor device) in accordance with one embodiment of the present invention.

Figure 4:
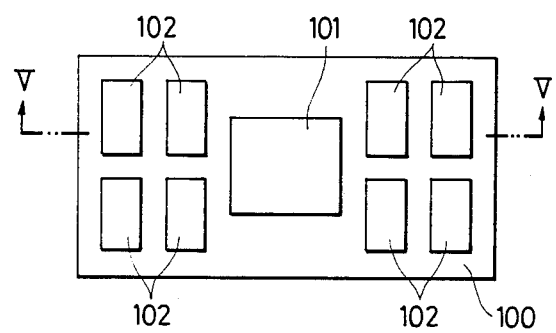
FIG. 4 is a plan view showing a silicon-on-silicon mother chip and child chips mounted thereon, which are incorporated in the multichip module illustrated in FIG. 3.

FIG. 4 is a plan view of a silicon-on-silicon mother chip and child chips mounted thereon, which are incorporated in the multichip module shown in FIG. 3.

Figure 5:
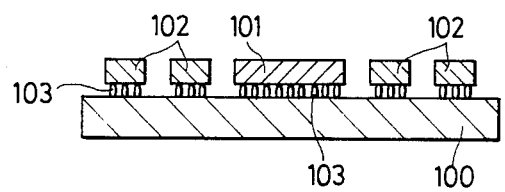
FIG. 5 is a sectional view taken along the line V—V in FIG. 4, which schematically shows a chip assembly.

FIG. 5 is a sectional view taken along the line V—V in FIG. 4, which shows the chip assembly illustrated in FIG. 4.

Figure 6:
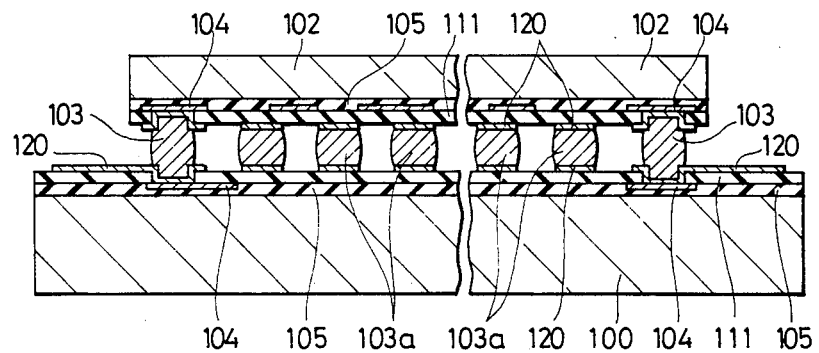
FIG. 6 is an enlarged view of the chip assembly illustrated in FIG. 5.
Figure 7:
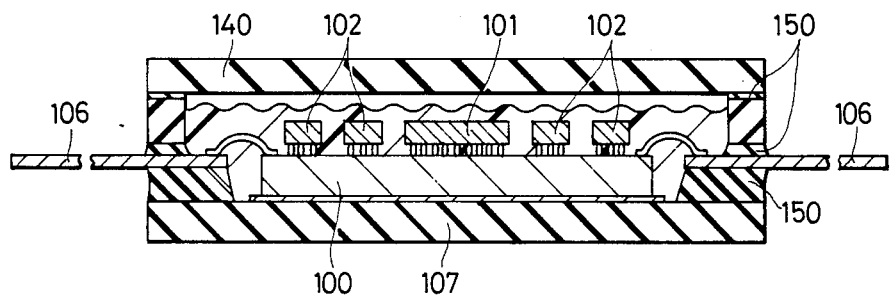
FIG. 7 is a sectional view of the semiconductor device after the chip assembly shown in FIG. 7 has been packaged.

FIG. 6 is an enlarged view of the chip assembly shown in FIG. 5. Further, FIG. 7 is a sectional view of the semiconductor device after the chip assembly has been packaged.

The semiconductor device in accordance with this embodiment is a high-speed memory module for a computer.

As shown in FIGS. 4 to 6 which are detailed views, one logic LSI chip 101 and eight memory LSI chips 102 are mounted on a mother chip 100.

The logic LSI chip 101 has about 600 bump electrodes 103 which include about 160 electric signal transferring bump electrodes and about 440 heat-dissipating bump electrodes.

Each of the eight memory LSI chips 102 has about 100 bump electrodes which include about 24 electric signal transferring bump electrodes and about 76 heat-dissipating bump electrodes.

As will be understood from the above description, an extremely large number of bump electrodes are formed on each of the logic and memory LSI chips, and all the bump electrodes are respectively welded to bump electrodes which are formed on the mother chip 100.

In the above-described example, a total number of bump electrodes which are formed on one logic LSI chip and the eight memory LSI chips is about 1,400 (600+100×8) which include about 352 (160+24×8) electric signal transferring bump electrodes and about 1,048 (440+76×8) heat-dissipating bump electrodes. Thus, about 75% of the total number of bump electrodes are exclusively employed for heat dissipation, and the electric signal transferring bump electrides also have the same function as the heat-dissipating bump electrodes in terms of heat transfer and therefore possess a heat-dissipating effect. In consequence, the heat generated in the LSI chips is transferred to the mother chip through about 1,400 bump electrodes.

The size of the logic LSI chip is about 7 mm×about 7 mm.

The size of each memory LSI chip is about 3 mm×about 6 mm.

The size of the mother chip is about 14 mm×about 25 mm.

Since an extremely large number (a total of about 1,400) bump electrodes are formed on the chips having the above-described sizes, it will be understood that the bump electrodes are arranged at an extremely high density, and each bump electrode is finely processed so as to be miniaturized.

The mother chip has a multilayer wiring structure consisting of an aluminum (Al) film 104 and an insulator film 105 which are stacked one upon the other on a silicon substrate. The mother chip is further provided with electric signal transferring bump electrodes which are electrically connected to the aluminum (Al) film 104 which defines an electrically conductive electric wiring in the multilayer wiring structure, and heat-dissipating bump electrodes which are formed on the surface of the multilayer wiring structure through a thin diamond film which serves as a ground layer.

The silicon substrate is made of the same kind of material as that for silicon substrates of the child chips 101 and 102, that is, one logic LSI chip 101 and eight memory LSI chips 102, in order to obtain coincidence in, for example, thermal expansion coefficient therebetween.

Leads 106 for external connection are provided along both the longer sides of the mother chip 100, 48 leads 106 for each side of the mother chip 100, that is, 96 leads 106 in total, the leads 106 being obtained by shaping a lead frame. FIG. 3 shows the leads 106 for external connection in section taken along a direction perpendicular to the shorter sides of the mother chip 100, and also shows the mother chip 100 in section taken along a direction parallel to the longer sides thereof. Therefore, it should be noted that, in the semiconductor device shown in FIG. 3, the mother chip 100 and the leads 106 are combined so that a sectional view of the mother chip 100 and a sectional view of the leads 106 can be illustrated in a single figure.

After the mother chip 100 (having the child chips 102 mounted thereon) has been secured to a board 107 of the package, the mother chip 100 is coated with a coating resin 108 of silicon gel by means of a potting technique.

In addition, a heat-dissipating fin 109 has a larger number of branch portions 109a than that of the heat-dissipating fin shown in Embodiment 1 for the purpose of improving the heat-dissipating characteristics.

The feature of the semiconductor device in accordance with this embodiment resides in the arrangement described above, and the other constituent parts are similar to those of the semiconductor device in accordance with Embodiment 1.

The semiconductor device in accordance with this embodiment will be explained in a manner similar to that in the description of the semiconductor device of Embodiment 1.

The bump electrodes 103 of the mother chip 100, which serves as a wiring board defined by a silicon substrate provided with a multilayer wiring structure, and the bump electrodes 103 of the child chips 101 and 102 are welded together so as to form a chip assembly. The bump electrodes 103 are made of solder.

A thin diamond film 111 is formed on the surface of the mother chip 100, and heat-dissipating bumps 103a are rigidly secured to the thin diamond film 111 through respective bonding metals 120 and are further connected to the respective child chips 102 formed in a manner similar to that of the mother chip 100. As illustrated in FIG. 3, one end portion of the mother chip 100 and one end portion of a lead 106 for external connection are wire-bonded using a connecting wire 130.

The leads 106 are interposed between the package board 107 and a cap 140 for the package. The reference numeral 150 in FIG. 3 denotes a sealing material.

As shown in FIG. 3, the heat-dissipating fin 109 is rigidly secured to the surface of the package board 107 on the side thereof which is remote from the mother chip 100. The thin diamond film 111 in the present invention is preferably formed by a known electron beam CVD (chemical vapor deposition) from the viewpoint of electrically insulating performance and deposition speed. It is possible to employ, in addition to the chemical vapor deposition, a method in which a gas mixture of methane and hydrogen is allowed to react under an appropriate pressure and heating temperature to form diamond in the shape of thin film, and a method in which an organic compound containing carbon, hydrogen and oxygen, e.g., alcohol, is employed in place of methane gas, and such organic compound is liquefied and reacted with hydrogen at an appropriate temperature to form a thin diamond film.

Each of the child chips 102 and 103 employed in the present invention is formed using, for example, a silicon single crystal substrate as a starting material, and has a multiplicity of circuit elements which are formed in the child chips 102 and 103 by a known technique, together with a multilayer wiring structure, thereby providing the chips with one circuit function such as an IC or LSI. Practical examples of the circuit elements are MOS transistors, and these circuit elements are arranged to provide a circuit function of, for example, a memory or logic circuit. The above-described circuit function of an IC or LSI is formed in the semiconductor active region.

The mother chip 100 is also formed using, for example, a silicon single crystal substrate as a starting material, and has a circuit function such as an IC or LSI and wiring, in a manner similar to that of the child chips 102 and 103.

The bumps 103 made of solder are constituted by bumps such as those which are employed as known flip chip connecting terminals, and defined by hemispheric bumps (salient electrodes) formed using, for example, tin (Sn)-containing lead (Pb) for controlled collapse bonding.

The barrier metal is defined by a triple layer structure consisting of, for example, a chromium (Cr) layer, a copper (Cu) layer and a gold (Au) layer, i.e., (Cr/Cu/Au).

The package board is made of, for example, silicon carbide SiC.

The leads for external connection are made of an alloy containing iron as its principal component, such as 42 Alloy or Kovar (trade name), or a Cu-based alloy.

The connecting wire is defined by, for example, a thin aluminum (Al) wire.

The heat-dissipating fin is made of, for example, aluminum (Al), and formed so as to have a multiplicity of branch portions in order to increase the surface area as much as possible.

According to the above-described embodiment of the present invention, the heat generated in the semiconductor active region of the child chips is dissipated through the thin diamond insulator film 111, the heat-dissipating bump 103a, the mother chip, the package board and the heat-dissipating fin 109. Since the thin diamond film 111, which is formed by the electron beam CVD, has excellent thermal conductivity, it is possible to obtain a multichip module having improved heat-dissipating characteristics.

Although the invention accomplished by the present inventors has practically been described through the embodiment, it should be noted here that the described embodiment is not necessarily limitative and various changes and modifications may, of course, be imparted thereto without departing from the scope and spirit of the invention.

For example, although in the above-described embodiment the thin diamond film 111 is coated on the insulator film made of silicon nitride $Si_3N_4$, the thin diamond film 111 may replace all the insulator film employed rather than replacing a part of the insulator film.

Although the present invention has mainly been described through one embodiment in which the invention is applied to a silicon-on-silicon multichip module that is a background art on which the present invention is based, such multichip module is not necessarily limitative, and the present invention may widely be applied to other types of semiconductor devices.

Thus, according to the present invention, the heat generated in a semiconductor active region is dissipated through a heat-dissipating bump which is connected to the active region through an insulator film made of diamond. It is therefore advantageously possible to improve the heat-dissipating characteristics of the semiconductor device.

A process for producing the semiconductor device in accordance with this embodiment will be explained below.

A semiconductor chip is formed by carrying out at least the following steps: namely, forming a semiconductor element on a semiconductor substrate; forming a multilayer wiring structure on the surface of the semiconductor substrate provided with the semiconductor element; forming a thin diamond film on the surface of the multilayer wiring structure; selectively removing a portion of the thin diamond film to expose the surface of an electrically conductive electric wiring constituting a part of the multilayer wiring structure; and forming bump electrodes on the surface of the thin diamond film and the exposed surface of the electric wiring, respectively.

The semiconductor chip in this case defines each of the logic and memory LSI chips.

Further, a mother chip is formed by carrying out at least the following steps: namely, forming an electric wiring region on a semiconductor substrate; forming a thin diamond film on the surface of the electric wiring region; selectively removing a portion of the thin diamond film to expose the surface of an electrically conductive electric wiring in the electric wiring region; and forming bump electrodes on the surface of the thin diamond film and the exposed surface of the electric wiring, respectively.

Then, the mother chip on the one hand and one logic LSI chip and eight memory LSI chips on the other are connected together in one unit by welding together their respective bump electrodes in such a manner that the bump electrodes are brought into contact with each other and subjected to a heat treatment, thereby forming a chip assembly.

The mother chip, on which are mounted child chips defined by the logic and memory LSI chips, is mounted on a board of a package through tin (Sn)-containing gold (Au) foil, and this chip assembly is secured to the package board by carrying out reflow (a heat treatment).

A lead frame having external leads is rigidly secured to the package board using a PbO low-melting glass (sealing glass), and bonding portions of the mother chip and the leads are interconnected by bonding wire using a wire bonding apparatus.

A frame 145 is rigidly secured to the packag board using the sealing glass as an adhesive, and the chip assembly is then coated with silicon gel employed as a coating resin by means of potting.

Thereafter, a cap for the package is secured to the frame 145 using a silicone resin as an adhesive, thereby hermetically sealing the chip assembly.

After the external leads have been subjected to solder dipping, an unnecessary frame portion of the lead frame is cut off, and the external leads are shaped by bending. Further, a heat-dissipating fin is rigidly secured to the package board using a silicone resin as an adhesive.

What is claimed is:

1. A semiconductor device comprising:
   a semiconductor substrate having a semiconductor element formed in a semiconductor active region;
   a multilayer wiring structure comprised of an insulator film and an electrically conductive electric wiring which are stacked one upon the other on the surface of said semiconductor substrate;
   a bump electrode for transferring an electric signal which is electrically connected to said electric wiring in said multilayer wiring structure; and
   a bump electrode for heat dissipation formed on the surface of said multilayer wiring structure through a thin diamond film as a ground layer.

2. A semiconductor device comprising:
   a semiconductor chip having at least a semiconductor substrate having a semiconductor element formed in a semiconductor active region, a multilayer wiring structure comprised of an insulator film and an electrically conductive electric wiring which are stacked one upon the other on the surface of said semiconductor substrate, a bump electrode for transferring an electric signal which is electrically connected to said electric wiring in said multilayer wiring structure, and a bump electrode for heat dissipation formed on the surface of said multilayer wiring structure through a thin diamond film as a ground layer; and
   a mother chip having an electric wiring region formed in a semiconductor employed as a substrate material, a bump electrode for transfering an electric signal which is electrically connected to said electric wiring region, and a bump electrode for heat dissipation which is formed on the surface of said electric wiring region through a thin diamond film as a ground layer,
   the respective bump electrodes of said semiconductor chip and said mother chip being welded together.

3. A semiconductor device comprising:
   a semiconductor chip having at least a semiconductor substrate having a semiconductor element formed in a semiconductor active region, a multilayer wiring structure comprised of an insulator film and an electrically conductive electric wiring which are stacked one upon the other on the surface of said semiconductor substrate, a bump electrode for transferring an electric signal which is electrically connected to said electric wiring in said multilayer wiring structure, and a bump electrode for heat dissipation formed on the surface of said multilayer wiring structure through a thin diamond film as a ground layer; and
   a mother chip having a semiconductor element with a circuit function provided on a semiconductor substrate, an electric wiring region provided on the surface of said substrate, a pad electrode which is electrically connected to said electric wiring region and to which an external lead is secured, a bump electrode for transferring an electric signal which is electrically connected to said electric wiring region, and a bump electrode for heat dissipation which is formed on the surface of said electric wiring region through a thin diamond film as a ground layer,
   the respective bump electrodes of said semiconductor chip and said mother chip being welded together.

4. A semiconductor device comprising:
   a semiconductor chip having at least a semiconductor substrate having a semiconductor element formed in a semiconductor active region, a multilayer wiring structure comprised of an insulator film and an electrically conductive electric wiring which are stacked one upon the other on the surface of said semiconductor substrate, a bump electrode for transferring an electric signal which is electrically connected to said electric wiring in said multilayer wiring structure, and a bump electrode for heat dissipation formed on the surface of said multilayer wiring structure through a thin diamond film as a ground layer;
   a mother chip having an electric wiring region formed on a semiconductor employed as a substrate material, a bump electrode for transferring an electric signal which is electrically connected to said electric wiring region, and a bump electrode for heat dissipation which is formed on the surface of said electric wiring region through a thin diamond film as a ground layer;
   a board and cap for a package;
   an external lead electrically connected to said electric wiring on said mother chip; and
   a heat-dissipating fin rigidly secured to said package board,
   the respective bump electrodes of said semiconductor chip and said mother chip being welded together in one unit which is secured to said package board and hermetically sealed by said package cap.

5. A process for producing a semiconductor device, comprising the steps of:
   preparing a mother chip having an electric wiring region formed on a semiconductor employed as a substrate material, a bump electrode for transferring an electric signal which is electrically connected to said electric wiring region, and a bump electrode for heat dissipation which is formed on the surface of said electric wiring region through a thin diamond film as a ground layer, and a semiconductor chip having at least a semiconductor substrate having a semiconductor element formed in a semiconductor active region, a multilayer wiring structure composed of an insulator film and an electrically conductive electric wiring which are stacked one upon the other on the surface of said semiconductor substrate, a bump electrode for transferring an electric signal which is electrically connected to said electric wiring in said multilayer wiring structure, and a bump electrode for heat dissipation formed on the surface of said multilayer wiring structure through a thin diamond film as a ground layer, the respective bump electrodes of said semiconductor chip and said mother chip being welded together in one unit;

rigidly securing said mother chip to which is secured said semiconductor chip to a board of a package, and securing an external lead to said electric wiring region on said mother chip;

hermetically sealing said mother chip, having said semiconductor chip secured thereto, with a cap for the package; and rigidly securing a heat-dissipating fin to said package board.

* * * * *